United States Patent [19]

Kershaw

[11] 4,112,394
[45] Sep. 5, 1978

[54] METHOD AND MEANS OF LINK COUPLING WITH SEPARATE CONTROL OF LINK REACTANCE AND COUPLING COEFFICIENT

[75] Inventor: Joseph E. Kershaw, La Mesa, Calif.

[73] Assignee: The United States of America as represented by the Secretary of the Navy, Washington, D.C.

[21] Appl. No.: 756,575

[22] Filed: Jan. 3, 1977

[51] Int. Cl.² .............................................. H03H 7/46
[52] U.S. Cl. ........................................ 333/6; 325/488; 333/77

[58] Field of Search ................ 336/147, 150; 325/488, 325/439, 489, 490; 333/6

[56] References Cited

U.S. PATENT DOCUMENTS 1,978,255  10/1934  Farnham ........................ 325/488 X Primary Examiner—Paul L. Gensler
Attorney, Agent, or Firm—R. S. Sciascia; G. J. Rubens; T. M. Phillips

[57] ABSTRACT

A method and means of link coupling to a tuned circuit in which the link reactance and the coupling coefficient are separately controlled. Mutual and direct coupling is utilized to effect this result.

2 Claims, 2 Drawing Figures

METHOD AND MEANS OF LINK COUPLING WITH SEPARATE CONTROL OF LINK REACTANCE AND COUPLING COEFFICIENT

BACKGROUND OF THE INVENTION

The present invention relates to link coupling and more particularly to link coupling to provide a sufficiently high coefficient of coupling in the 30-76 MHz range and at power levels in the 100 watt range. At the frequencies of interest (30-76 MHz), the maximum coefficient of coupling that can be obtained by mutual coupling is limited because of the physical characteristics of the coupling link. Because of these physical constraints in prior known multicoupler systems such as the AN/-SRA-60 the highest number of channels that can be combined are four. This typical coupling is shown in FIG. 1 where the link $L_2$, is positioned to obtain the maximum coupling coefficient. It has been found that this coupling is not sufficient for combining more than four channels while delivering power in the 100 watt range.

SUMMARY OF THE INVENTION

The present invention provides for a means and method of link coupling which allows an increase in the range of coupling coefficients. A coupling link having the desired reactance is positioned with respect to the inductor component of the tuned circuit to provide close coupling. The usually grounded end of the link coupling is disconnected from ground and connected to a point above ground on the inductor of the tuned circuit component to provide the desired increase in coupling coefficient.

Accordingly, an object of the present invention is to provide link coupling to a tuned circuit with a desired link reactance and simultaneously allowing an increased range of coupling coefficients.

Other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Figure 1:
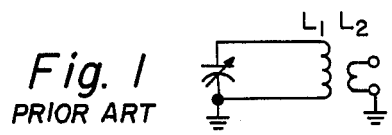
FIG. 1 shows conventional mutual coupling.
Figure 2:
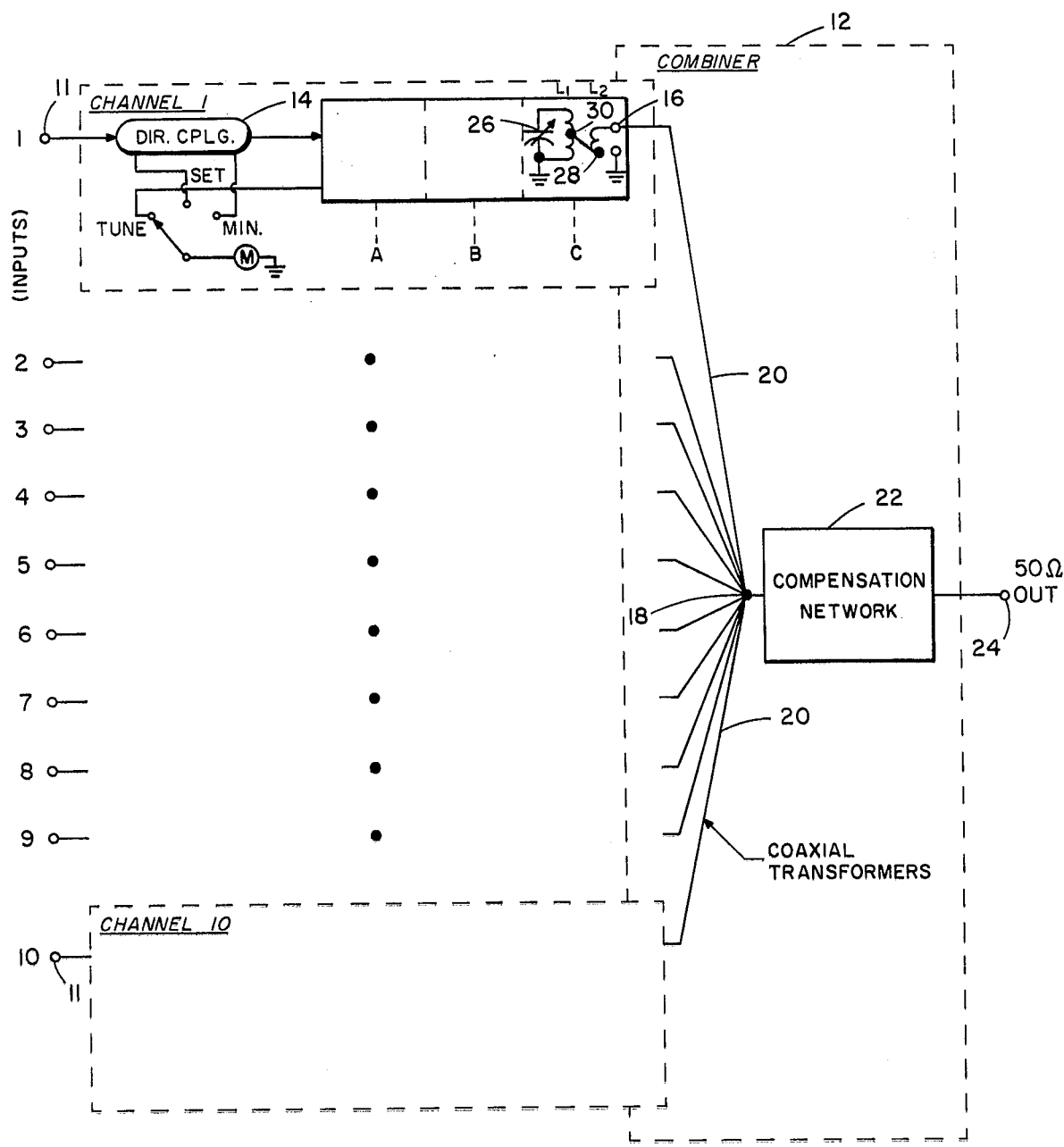
FIG. 2 shows the invention utilized in a multicoupler.

Referring now to the drawings wherein there is shown in FIG. 2 a multicoupler in which the invention is used. As shown, a plurality of variable frequency channels, each tunable to a particular band pass is combined in a combiner circuit 12. Each variable frequency channel includes an input/output terminal 11 connected to a directional coupler 14. Directional coupler 14 is connected to tunable circuits A, B, and C. Inasmuch as the invention is directed to the link coupling to tunable filter C, the filters A, B, and directional coupler 14 are not shown in detail. The output of filter circuit C at terminal 16 is connected to a common junction 18 by means of coaxial transformer 20. In order to match the impedance at junction 18 to a standard 50 ohm coaxial cable, a standard compensation network 22 is provided between junction 18 and the 50Ω terminal 24.

Referring now in more detail to the tuned filter C, which comprises variable capacitor 26 and inductor $L_1$. The energy is coupled into and out of filter C by means of a coil $L_2$. The normally grounded end 28 of coil $L_2$ is connected to a point 30 on $L_1$ at a distance along the coil from ground to increase the coupling coefficient to the desired value. The point at which the connection is made is selected by varying the connection point along coil, $L_1$, until the desired measured coupling is achieved.

According to the invention, more than four channels and at least 10 channels can be combined in a multicoupler by simultaneously mutually coupling and connecting one end of the coupling link $L_2$ (as shown in FIG. 2) to the inductor $L_1$ of the tuned circuit. By way of example, the following was found satisfactory when the invention was used in a 10 channel multicoupler. Link $L_2$ was made of 1 and 1¼ turns of number 16 solid copper tinned wire, forming a coil 1¾ inches in diameter, and was tapped to the inductor $L_1$ at a point 3⅛ inches from its grounded end. The 3⅛ inches is measured along the helix, $L_1$, from the ground end. The coaxial transformers connecting the output at terminal 16 to the combiner terminal 18 consisted of ⅜ inch dielectric coaxial cable. Each 16 inch length includes a ¾ inch pigtail for junction termination. The output impedance as seen at the filter output (terminal 16 is transformed through the 16 inch length of air-dielectric coaxial cable ($\theta = 13.7°$ at 30 MHz) to the combiner junction 18. Compensation network 22 may be designed in the usual manner using Mattaei's method and Smith-chart analysis to provide an output impedance of 50 ohms at terminal 24.

Obviously many modifications and variations of the present invention are possible in the light of the above teachings. It is therefore to be understood that within the scope of the appended claims the invention may be practiced otherwise than as specifically described.

What is claimed is:

1. A multicoupler for coupling in the 30-76 MHz range and at power levels in the 100 watt range comprising:
 a plurality of not less than four variable frequency channels, each channel including an input/output terminal and being tunable to a particular band pass within said 30-76 MHz range;
 combiner circuit means including a common junction;
 each of said channels having a link coupler including an inductor coil from which energy is to be coupled and having a first terminal coupled to said input/output terminal and a second terminal connected to ground, a reactive link of a predetermined reactance having an input terminal and an output terminal positioned for close coupling with said inductor coil and means connecting said reactive link input terminal to said inductor coil at a point above ground to provide the desired coupling coefficient; and
 coaxial transformer means connecting the output terminl of said reactive link to said common junction.

2. The multicoupler of claim 1 wherein said plurality of variable frequency channels include at least ten.

* * * * *